United States Patent
Lee et al.

(10) Patent No.: US 9,182,458 B2
(45) Date of Patent: Nov. 10, 2015

(54) MAGNETORESISTIVE SENSING DEVICE

(71) Applicant: VOLTAFIELD TECHNOLOGY CORPORATION, Jhubei, Hsinchu County (TW)

(72) Inventors: Chien-Min Lee, Zhudong Township, Hsinchu County (TW); Fu-Tai Liou, Zhubei (TW); Ta-Yung Wong, Hsinchu (TW)

(73) Assignee: VOLTAFIELD TECHNOLOGY CORPORATION, Jhubei, Hsinchu County (TW)

( * ) Notice: Subject to any disclaimer, the term of this patent is extended or adjusted under 35 U.S.C. 154(b) by 318 days.

(21) Appl. No.: 13/737,797

(22) Filed: Jan. 9, 2013

(65) Prior Publication Data

US 2013/0176022 A1 Jul. 11, 2013

(30) Foreign Application Priority Data

Jan. 9, 2012 (TW) .............................. 101100799 A
Dec. 12, 2012 (TW) .............................. 101146943 A

(51) Int. Cl.
*G01R 33/02* (2006.01)
*G01R 33/09* (2006.01)
*B82Y 25/00* (2011.01)

(52) U.S. Cl.
CPC ............... *G01R 33/096* (2013.01); *B82Y 25/00* (2013.01); *G01R 33/09* (2013.01); *G01R 33/093* (2013.01)

(58) Field of Classification Search
CPC ...... G11B 5/3903; G11B 5/3906; G11B 5/39; G11B 5/398; G11B 2005/0016; G01R 33/093; G01R 33/098; G01R 33/09; G01R 33/091; B82Y 25/00; H01F 41/32; H01L 43/08; H01L 43/12
USPC ............ 324/207.21, 228, 232, 244, 249, 252, 324/301; 360/110–112, 313–316, 360/327.1–327.11, 322, 324.11–324.12, 360/325, 327.22, 119.1, 123.28; 365/158; 338/32 R
See application file for complete search history.

(56) References Cited

U.S. PATENT DOCUMENTS 5,247,278 A * 9/1993 Pant et al. .................... 338/32 R
5,712,751 A * 1/1998 Yoda et al. ............... 360/327.32
(Continued)

FOREIGN PATENT DOCUMENTS

CN    1063960 A    8/1992
CN    1701241 A    11/2005
(Continued)

OTHER PUBLICATIONS

Athanasios Chalastaras, Leszek M. Malkinski, Member IEEE, Jin-Seung Jung, Seung-Lim Oh, Jin-Kyu Lee, Carl A. Ventrice, Jr., Volodymyr Golub and Gleander Taylor, "GMR Multilayers on a New Embossed Surface", IEEE Transactions on Magnetics, Jul. 2004, pp. 2257-2259, vol. No. 40, Issue No. 4, IEEE.

(Continued)

*Primary Examiner* — Patrick Assouad
*Assistant Examiner* — Sean Curtis
(74) *Attorney, Agent, or Firm* — Cheng-Ju Chiang

(57) ABSTRACT

A magnetoresistive sensing device includes a substrate, a magnetic layer, a first electrode and a second electrode. The substrate has a reference plane. The first electrode and a second electrode are disposed over the reference plane. The magnetic layer is disposed over the reference plane and has a magnetization direction. A non-straight angle is formed between the magnetic layer and the reference plane. The first electrode and the second electrode are electrically connected with each other through an electric pathway of the magnetic layer. An included angle is formed between the electric pathway and the magnetization direction. Consequently, the magnetoresistive sensing device is capable of measuring a magnetic field change in a Z-axis direction, which is perpendicular to a reference plane.

19 Claims, 7 Drawing Sheets

(56) References Cited

U.S. PATENT DOCUMENTS

| | | | |
|---|---|---|---|
| 5,898,546 A * | 4/1999 | Kanai et al. | 360/324.1 |
| 5,898,548 A * | 4/1999 | Dill et al. | 360/324.2 |
| 5,935,453 A * | 8/1999 | Fontana et al. | 216/22 |
| 5,959,809 A * | 9/1999 | Uehara | 360/327.22 |
| 5,978,182 A * | 11/1999 | Kanai et al. | 360/324.1 |
| 5,991,125 A * | 11/1999 | Iwasaki et al. | 360/324.12 |
| 6,002,553 A * | 12/1999 | Stearns et al. | 360/324 |
| 6,054,226 A * | 4/2000 | Takeda et al. | 428/682 |
| 6,157,525 A * | 12/2000 | Iwasaki et al. | 360/324.12 |
| 6,166,539 A * | 12/2000 | Dahlberg et al. | 324/252 |
| 6,252,749 B1 * | 6/2001 | Hayakawa | 360/320 |
| 6,529,114 B1 * | 3/2003 | Bohlinger et al. | 338/32 R |
| 6,721,141 B1 * | 4/2004 | Attenborough et al. | 360/324 |
| 6,831,817 B2 * | 12/2004 | Hasegawa et al. | 360/324.12 |
| 6,867,952 B2 * | 3/2005 | Hasegawa | 360/324.12 |
| 6,917,088 B2 * | 7/2005 | Takahashi et al. | 257/422 |
| 6,943,041 B2 * | 9/2005 | Sugita et al. | 438/3 |
| 6,961,222 B2 * | 11/2005 | Kishi | 360/321 |
| 7,005,201 B2 * | 2/2006 | Hasegawa et al. | 428/811.5 |
| 7,005,958 B2 * | 2/2006 | Wan | 338/32 R |
| 7,280,322 B2 * | 10/2007 | Takahashi et al. | 360/324.1 |
| 7,532,436 B2 * | 5/2009 | Hinoue et al. | 360/131 |
| 8,518,734 B2 * | 8/2013 | Whig et al. | 438/73 |
| 8,928,602 B1 * | 1/2015 | Wan | 345/173 |
| 8,981,773 B2 * | 3/2015 | Pozzati et al. | 324/252 |
| 2002/0034055 A1 * | 3/2002 | Seyama et al. | 360/324.11 |
| 2003/0184921 A1 * | 10/2003 | Sugita et al. | 360/324.1 |
| 2004/0004261 A1 * | 1/2004 | Takahashi et al. | 257/414 |
| 2004/0165319 A1 * | 8/2004 | Wan et al. | 360/324.1 |
| 2006/0176142 A1 * | 8/2006 | Naito et al. | 338/32 R |
| 2007/0264422 A1 * | 11/2007 | Zimmer | 427/127 |
| 2008/0198514 A1 | 8/2008 | Jogo et al. | |
| 2008/0316654 A1 * | 12/2008 | Aiso | 360/324 |
| 2009/0015252 A1 * | 1/2009 | Raberg et al. | 324/252 |
| 2009/0027048 A1 * | 1/2009 | Sato et al. | 324/247 |
| 2009/0128282 A1 * | 5/2009 | Zimmer et al. | 338/32 R |
| 2009/0190264 A1 * | 7/2009 | Fukuzawa et al. | 360/246.4 |
| 2011/0074406 A1 * | 3/2011 | Mather et al. | 324/252 |
| 2011/0244599 A1 * | 10/2011 | Whig et al. | 438/3 |
| 2012/0074511 A1 * | 3/2012 | Takahashi et al. | 257/427 |
| 2013/0176022 A1 * | 7/2013 | Lee et al. | 324/252 |
| 2013/0299930 A1 * | 11/2013 | Paci et al. | 257/422 |

FOREIGN PATENT DOCUMENTS

| | | |
|---|---|---|
| CN | 102183793 A | 9/2011 |
| TW | 200703732 A | 1/2007 |
| TW | 201142336 A1 | 12/2011 |
| WO | 2011/074488 A1 | 6/2011 |
| WO | 2011074488 A1 | 6/2011 |

OTHER PUBLICATIONS

F.J. Jeffers, "Magnetoresistive Transducer with Canted Easy Axis", IEEE Transactions on Magnetics, Nov. 1979, pp. 1628-1630, vol. No. Mag-15, Issue No. 6, IEEE, San Diego, CA, U.S.A.

Xiao-Yong Xu, Li-Jie Qian and Jing-Guo Hu, "Magnetoresistance Induced by the Stress Field in Ferromagnetic Multilayer", ACTA Physica Sinica, Mar. 2009, pp. 2023-2029, vol. No. 58, Issue No. 3; China Physics Society, Yangzhou, China.

* cited by examiner

MAGNETORESISTIVE SENSING DEVICE

FIELD OF THE INVENTION

The present invention relates to a magnetoresistive sensing device, and particularly to a magnetoresistive sensing device fabricated by a semiconductor manufacturing process.

BACKGROUND OF THE INVENTION

With the development of consumer electronic products such as mobile phones and electronic compasses, additionally together with conventional products such as motors and brakes, the demand on a magnetoresistive-type sensing device (also referred as magnetoresistive sensing device) is progressively increasing. Especially, a three-dimensional magnetoresistive sensing device is usually used to sense the magnetic field changes of three orthogonal axes (i.e. the X, Y and Z axes). For example, the electronic compass utilizes the three-dimensional magnetoresistive sensing device to precisely measure the earth's magnetic field.

As known, the technology of using a semiconductor manufacturing process to fabricate a two-dimensional planar magnetoresistive sensing device has been well established. However, it is difficult to use a single semiconductor substrate to construct a three-dimensional magnetoresistive sensing device. With the package assembling approach, one planar magnetoresistive sensing chip responsible for measuring the Z-axis magnetic field parallel to the horizontal plane of the substrate should be mounted orthogonally to the other planar magnetoresistive sensing chip responsible for measuring the magnetic field in the X and Y-axis directions in the horizontal plane of the substrate. With alternative approach employing magnetic flux guide, the magnetic field in the Z-axis direction perpendicular to the horizontal plane of the substrate is conducted to the X-Y direction parallel with the horizontal plane of the substrate by a flux concentrator, and then the magnetic field change in the Z-axis direction is measured by an X-Y magnetoresistive sensing device.

From the description above, the conventional device for measuring the magnetic field change in the Z-axis direction has a very complicated structure and high fabricating cost. Moreover, since the process variation of vertical assembling of the chips should be further taken into consideration, the production yield is adversely affected.

For solving the above drawbacks, there is a need of providing an improved magnetoresistive sensing device and a fabricating method thereof. Moreover, the improved magnetoresistive sensing device for measuring the magnetic field change in the Z-axis direction can be merged with other magnetoresistive sensing devices responsible for sensing magnetic field in the X and Y-axis directions to form an integrated three-dimensional magnetoresistive sensing device on a single chip, which is fabricated by a semiconductor manufacturing process.

SUMMARY OF THE INVENTION

The present invention provides a magnetoresistive sensing device. The magnetoresistive sensing device includes a substrate, a magnetic layer, a first electrode and a second electrode. The substrate has a reference plane. The first electrode and the second electrode are disposed over the reference plane. The magnetic layer is disposed over the reference plane and has a magnetization direction. A non-straight angle is formed between the magnetic layer and the reference plane. The first electrode and the second electrode are electrically connected with each other through an electric pathway of the magnetic layer. A first included angle is formed between the electric pathway and the magnetization direction. Consequently, the magnetoresistive sensing device is capable of measuring a magnetic field change in a Z-axis direction, which is perpendicular to a reference plane.

In accordance with the present invention, the magnetoresistive sensing device has a magnetic layer, wherein a non-straight angle is formed between the magnetic layer and the reference plane. Consequently, a magnetoresistive sensing unit for measuring the magnetic field change in the Z-axis direction perpendicular to the reference plane is obtained. Moreover, the magnetoresistive sensing unit for measuring the magnetic field change in the Z-axis direction and the magnetoresistive sensing units for sensing the magnetic field change in the X-Y direction parallel with the reference plane may be integrated into a three-dimensional magnetoresistive sensing device. More especially, the magnetoresistive sensing units for sensing the three-dimensional magnetic field changes may be formed on the same semiconductor chip. Since the additional flux concentrator is not necessary, the magnetoresistive sensing device of the present invention has a simplified structure. Moreover, the method for fabricating the magnetoresistive sensing device of the present invention is simplified and cost-effective and has a good production yield.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention provides a magnetoresistive sensing device. The magnetoresistive sensing device is fabricated by a semiconductor manufacturing process. The magnetoresistive sensing device is capable of measuring a magnetic field change in a Z-axis direction, which is perpendicular to a reference plane. The above and other objects, features and advantages of the present invention will become more readily apparent after reviewing the following detailed description and accompanying drawings. In the following embodiments, the magnetoresistive sensing device will be illustrated by referring to an anisotropic magnetoresistance (AMR) sensing device.

Figure 1:
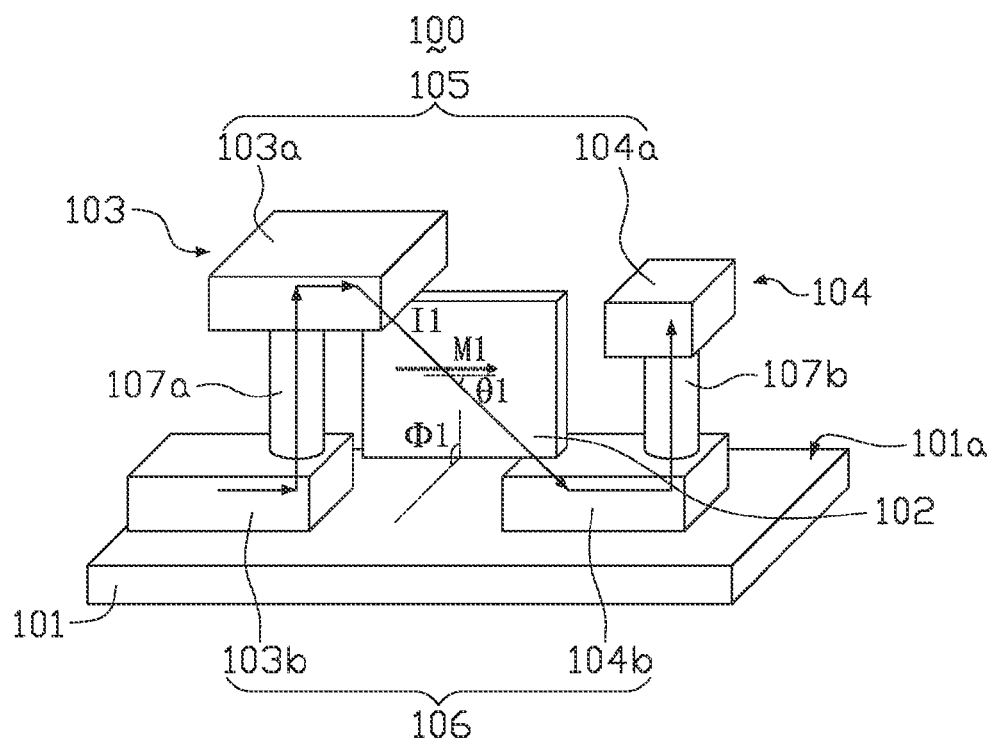
FIG. 1 is a schematic perspective view illustrating a magnetoresistive sensing device according to an embodiment of the present invention.

FIG. 1 is a schematic perspective view illustrating a magnetoresistive sensing device according to an embodiment of the present invention.

As shown in FIG. 1, the magnetoresistive sensing device 100 is an AMR sensing unit. The magnetoresistive sensing device 100 comprises a substrate 101, a magnetic layer 102, an electrode 103, and an electrode 104. The substrate 101 is a silicon substrate covered with insulating material. Alternatively, the substrate 101 is a silicon chip with front-end logic circuits (previously formed logic circuits). The substrate 101 has a reference plane 101a. The electrode 103 and the electrode 104 are disposed over the reference plane 101a of the substrate 101.

In some embodiments of the present invention, the electrode 103 and the electrode 104 are separated from each other, and buried within a dielectric layer (not shown) over the reference plane 101a. In some embodiments of the present invention, the electrode 103 and the electrode 104 comprise two non-coplanar patterned metal layers 105 and 106 and two via plugs 107a and 107b. The two non-coplanar patterned metal layers 105 and 106 are connected with each other through the two via plugs 107a and 107b.

In this embodiment, an upper part 103a of the electrode 103 and an upper part 104a of the electrode 104 are parts of the patterned metal layer 105. A lower part 103b of the electrode 103 and a lower part 104b of the electrode 104 are parts of the patterned metal layer 106. The upper part 103a and the lower part 103b of the electrode 103 are connected with each other through the via plug 107a. The upper part 104a and the lower part 104b of the electrode 104 are connected with each other through the via plug 107b.

The magnetic layer 102 is disposed over the reference plane 101a. The included angle Φ1 between the magnetic layer 102 and the reference plane 101a of the substrate 101 is a non-straight angle. Moreover, the electrode 103 and the electrode 104 are electrically connected with each other through the magnetic layer 102. The magnetic layer 102 is made of, but not limited to, ferromagnetic material, antiferromagnetic material, non-ferromagnetic metallic material, tunneling oxide, or a combination thereof. When the external magnetic field is zero, a magnetization direction M1 of the magnetic layer 102 will be subject to the shape anisotropy and parallel with the plane of the magnetic layer 102.

In some embodiments of the present invention, the magnetic layer 102 is a single-layer magnetic material structure or a multilayer magnetic stack structure, which is disposed over the reference plane 101a of the substrate 101. The included angle Φ1 between the plane of the magnetic layer 102 and the reference plane 101a of the substrate 101 is a non-straight angle (e.g. between 70° and 90°). In this embodiment, the magnetic layer 102 is in direct contact with the upper part 103a of the electrode 103 and the lower part 104b of the electrode 104. Consequently, the electrode 103 and the electrode 104 are electrically connected with each other through the magnetic layer 102. After the electrode 103 and the electrode 104 are electrically connected with each other, an electric pathway I1 with the minimum electrical resistance is determined according to an electric current flowing through the magnetic layer 102. Moreover, a specified included angle θ1 is formed between the electric pathway I1 and the magnetization direction M1. If the external magnetic field is zero, the magnetization direction M1 will be parallel with the plane and the long axis of the magnetic layer 102 due to shape anisotropy and the specified included angle θ1 is preferably 45°.

Figure 2:
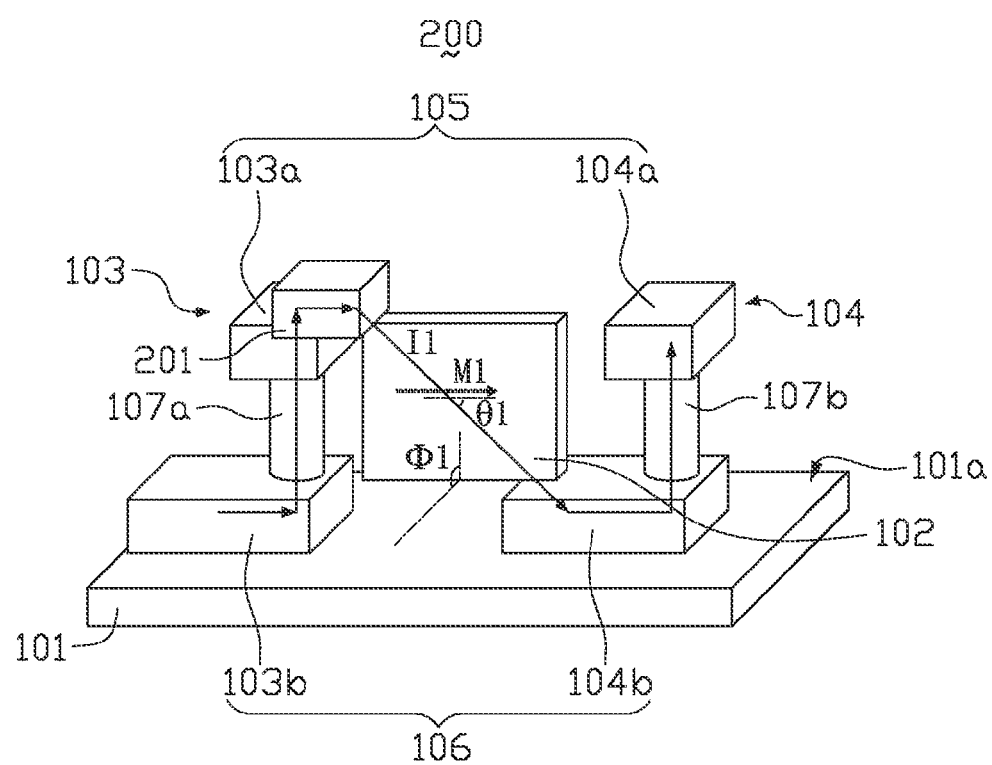
FIG. 2 is a schematic perspective view illustrating a magnetoresistive sensing device according to another embodiment of the present invention.

In some embodiments of the present invention, the magnetoresistive sensing unit may further comprise an additional magnetic layer or an additional metal conductor parallel with the reference plane 101a in order to increase the contact area and reduce the contact resistance between the magnetic layer 102 and the electrodes 103 and 104. Such a magnetoresistive sensing unit will be illustrated with reference to FIG. 2. FIG. 2 is a schematic perspective view illustrating a magnetoresistive sensing device according to another embodiment of the present invention.

Except that the magnetoresistive sensing device 200 further comprises a magnetic layer 201 parallel with the reference plane 101a, the structures of the magnetoresistive sensing device 200 of this embodiment are substantially identical to those of the magnetoresistive sensing device 100. By the magnetic layer 201, the magnetic layer 102 is electrically connected with the upper part 103a of the electrode 103. That is, after an electric current is introduced into the electrode 103, the electric current is firstly transferred to the magnetic layer 102 through the magnetic layer 201 and then transferred to the electrode 104. The material of the magnetic layer 201 may be identical to or different from the material of the magnetic layer 102. If the magnetic layer 201 and the magnetic layer 102 are made of the same material, the magnetic layer 201 and the magnetic layer 102 may be integrally formed at the same processing step. In some embodiments of the present invention, the magnetic layer 201 may be replaced by a metal conductor.

Similarly, for increasing the contact area and reducing the contact resistance between the magnetic layer 102 and the electrode 104, the magnetoresistive sensing unit may further comprises an additional magnetic layer (not shown). Through the additional magnetic layer, the magnetic layer 102 is electrically connected with the lower part 104a of the electrode 104. The structure and the function of the additional magnetic layer are similar to those of the magnetic layer 201, and are not redundantly described herein.

Please refer to FIG. 1 again. If an external magnetic field parallel with the magnetic layer 102 is applied to the magnetoresistive sensing device 100, when the direction or magnitude of the external magnetic field is changed, the magnetization direction M1 is correspondingly changed. Assume the direction of the electric pathway is fixed, the specified included angle θ1 will be consequently changed. Under this circumstance, the magnetoresistance value is correspondingly increased or decreased. Since the change of the magnetization direction M1 occurs on the plane of the magnetic layer 102, and the non-straight angle Φ1 is formed between the magnetic layer 102 and the reference plane 101a of the substrate 101, the magnetoresistive sensing device 100 can be used to sense the magnetic field change in the Z-axis direction, which is substantially parallel with the plane of magnetic layer 102 and perpendicular to the reference plane 101a of the substrate 101.

In the above embodiments, each of the magnetoresistive sensing device 100 and the magnetoresistive sensing device 200 employs the anisotropic magnetoresistance (AMR) structure comprising a single magnetic film (i.e. the magnetic layer 102). In some embodiments of the present invention, the magnetoresistive sensing device 100 may have a giant magnetoresistance (GMR) structure, a tunneling magnetoresistance (TMR) structure or a colossal magnetoresistance (CMR) structure with the magnetic layer 102 made of multiple magnetic films.

For increasing the sensing capability of the magnetoresistive sensing device, plural magnetoresistive sensing devices may be combined into an integrated magnetoresistive sensing device, so that a stronger sensing signal can be obtained.

Figure 3:
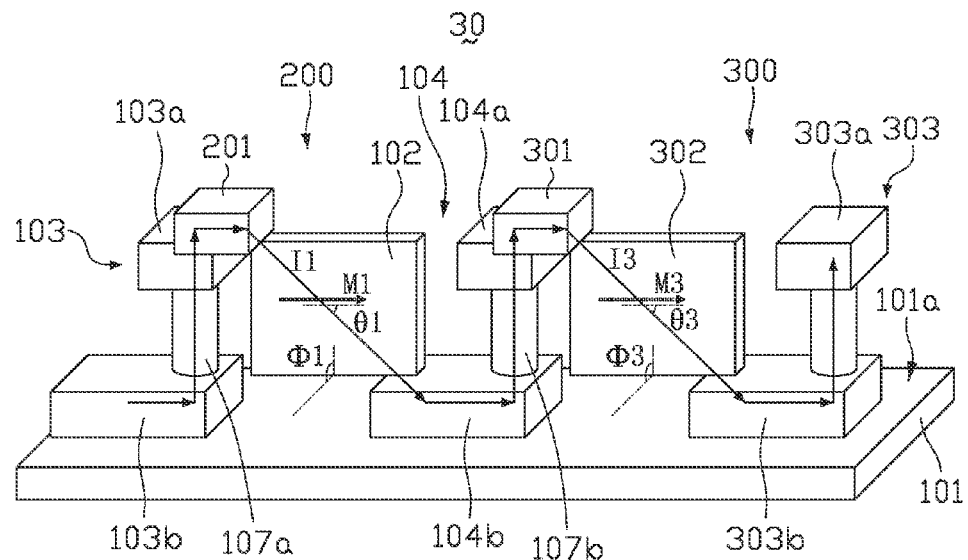
FIG. 3 is a schematic perspective view illustrating a magnetoresistive sensing device according to an embodiment of the present invention.

FIG. 3 is a schematic perspective view illustrating a magnetoresistive sensing device according to an embodiment of the present invention. In addition to the magnetoresistive sensing device 200 of FIG. 2, the magnetoresistive sensing device 30 of FIG. 3 further comprises an electrode 303 and two magnetic layers 301 and 302. The electrode 104 and the electrode 303 are electrically connected with each other through the magnetic layers 301 and 302. In other words, electrode 104, the electrode 303 and the magnetic layers 301 and 302 are collaboratively defined as another magnetoresistive sensing device 300.

Similarly, a non-straight angle Φ3 (e.g. between 70° and 90°) is formed between the plane of magnetic layer 302 and the reference plane 101a of the substrate 101. The magnetic layer 301 is spanned across the magnetic layer 302 and the upper part 104a of the electrode 104. Consequently, the electrode 104 and the electrode 303 are electrically connected with each other through the magnetic layers 301 and 302. After the electrode 104 and the electrode 303 are electrically connected with each other, an electric pathway I3 is determined according to an electric current flowing through the magnetic layer 302. Moreover, a specified included angle θ3 is formed between the electric pathway I3 and the magnetization direction M3. If the external magnetic field is zero, the magnetization direction M3 will be parallel with the plane and the long axis of the magnetic layer 302 due to shape anisotropy and the specified included angle θ3 is preferably 45°.

In this embodiment, the magnetic layer 302 and the magnetic layer 102 may be coplanar. The magnetic layer 301 and the magnetic layer 201 may also be coplanar, and parallel with the reference plane 101a of the substrate 101. In other words, the non-straight angle Φ3 between the plane of the magnetic layer 302 and the reference plane 101a and the non-straight angle Φ1 between the plane of the magnetic layer 102 and the reference plane 101a may be the same. The magnetization direction M3 of the magnetic layer 302 may be identical to the magnetization direction M1 of the magnetic layer 102. The electric pathway I3 of the magnetic layer 302 may be parallel with the electric pathway I1 of the magnetic layer 102. If the external magnetic field is zero, each of the angles θ1 and θ3 is preferably 45°. Since the magnetoresistive sensing devices 200 and 300 are electrically connected with each other, the integrated magnetoresistive sensing device 30 can amplify the magnetic sensing signal.

Figure 4:
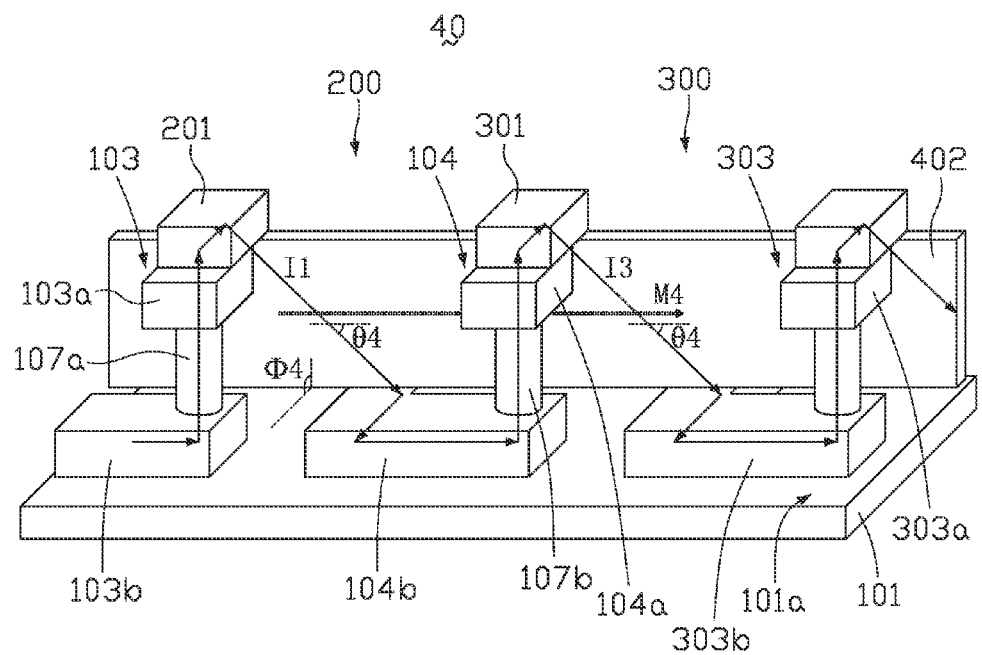
FIG. 4 is a schematic perspective view illustrating a magnetoresistive sensing device according to another embodiment of the present invention.

FIG. 4 is a schematic perspective view illustrating a magnetoresistive sensing device according to another embodiment of the present invention. Except that a magnetic layer 402 is shared by the two adjacent magnetoresistive sensing devices 200 and 300 of the magnetoresistive sensing device 40, the structures of other components of the magnetoresistive sensing device 40 are substantially identical to those of the magnetoresistive sensing device 30, and are not redundantly described herein.

In comparison with the magnetoresistive sensing device 30 of FIG. 3, the magnetic layer 402 of the magnetoresistive sensing device 40 of FIG. 4 is made of the same material and integrally formed by the same producing process. The non-straight angle Φ4 between the plane of the magnetic layer 402 and the reference plane 101a is preferably between 70° and 90°. The magnetic layer 402 has a single magnetization direction M4. Moreover, since the magnetic layer 402 is in contact with the electrodes 103, 104 and 303 simultaneously, these electrodes 103, 104 and 303 are electrically connected with each other through the magnetic layer 402. Moreover, in the magnetic layer 402, the electric pathway I1 between the electrode 103 and the electrode 104 and the electric pathway I3 between the electrode 303 and the electrode 104 are both defined. Moreover, in this embodiment, a specified included angle θ4 is formed between each of the electric pathways (I1 and I3) and the magnetization direction M4. If the external magnetic field is zero, the magnetization direction M4 will be parallel with the plane and the long axis of the magnetic layer 402 due to shape anisotropy and the specified included angle θ4 is preferably 45°.

Since the magnetic layer 402 is directly spanned across the electrodes 103, 104 and 303, if the electrodes 103, 104 and 303 are too close, a planar jumper resistance through the magnetic layer 402 spanning from the electrode 103 to electrode 303 will be too small. Consequently, a greater portion of the electric current flows through the spanned region of the magnetic layer 402, but only a smaller portion of the electric current flows through the predestinated electric pathways I1 and I3. Under this circumstance, the magnetoresistive sensing device 40 will perform less effectively. To allow the current flowing from the electrode 103 through the destined electric pathway I1, the planar jumper resistance R of the magnetic layer 402 spanned across the magnetic layer 201 and the magnetic layer 301 should be much higher than the sum of the resistance value Ra of the electric pathway I1, the resistance value Rb of the lower part 104b of the electrode 104, the resistance value Rc of the via plug 107b, the resistance value Rd of the upper part 104a of the electrode 104 and the resistance value Re of the magnetic layer 301. That is, the relationships between these resistance values may be expressed as: Ra+Rb+Rc+Rd+Re≪R.

Since the common magnetic layer 402 is longer than the separate magnetic layers (e.g. the magnetic layers 102 and 302 as shown in FIG. 3), the switching field of changing the magnetization direction M4 may be reduced. Consequently, the shared magnetic layer 402 is more sensitive to the change of the external magnetic field and has enhanced sensing capability.

Figure 5:
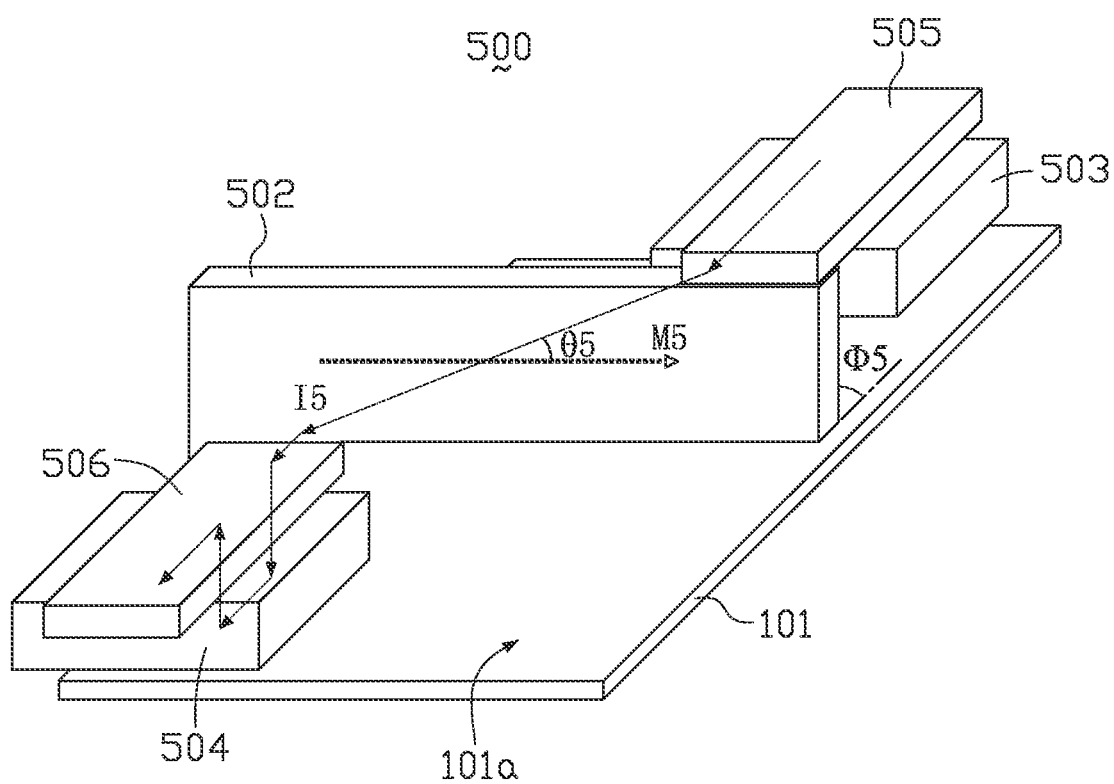
FIG. 5 is a schematic perspective view illustrating a magnetoresistive sensing device according to another embodiment of the present invention.

FIG. 5 is a schematic perspective view illustrating a magnetoresistive sensing device according to another embodiment of the present invention.

As shown in FIG. 5, the magnetoresistive sensing device 500 comprises at least one substrate 101, an electrode 503, an electrode 504, and three magnetic layers 502, 505 and 506, which are all disposed over the reference plane 101a of the substrate 101. The electrode 503 and the electrode 504 belong to two non-coplanar patterned metal layers. The magnetic layer 502 is disposed over the reference plane 101a. The included angle Φ5 between the magnetic layer 502 and the reference plane 101a of the substrate 101 is a non-straight angle (e.g. between 70° and 90°).

That is, the magnetic layer 502 is nearly upright on the reference plane 101a of the substrate 101. In this embodiment, the magnetic layer 502 is electrically connected with the electrode 503 through the magnetic layer 505, and the magnetic layer 502 is electrically connected with the electrode 504 through the magnetic layer 506. The magnetic layer 505 is disposed over the electrode 503, and contacted with the magnetic layer 502 and the electrode 503. The magnetic layer 506 is disposed over the electrode 504, and contacted with the magnetic layer 502 and the electrode 504.

When an electric current is introduced into the magnetic layer 502 from the electrode 503, an electric pathway I5 with the minimum electrical resistance is determined according to an electric current flowing through the magnetic layer 502. Consequently, the magnetic layers 505 and 506 are electrically connected with each other. The electric current is then transferred to the electrode 504. Due to the shape anisotropy of the magnetic layer 502, if the external magnetic field is zero, the magnetic layer 502 has a magnetization direction M5 parallel with the plane and the long axis of the magnetic layer 502. Moreover, a specified included angle θ5 is formed between the electric pathway I5 and the magnetization direction M5. The specified included angle θ5 is preferably 45°.

If an external magnetic field perpendicular to the reference plane 101a is applied to the magnetoresistive sensing device 500, the magnetization direction M5 will response to the external magnetic field and change. Assume the direction of the electric pathway is fixed, the specified included angle θ5 will be consequently changed. Under this circumstance, the magnetoresistance value is correspondingly increased or decreased. Since the change of the magnetization direction M5 occurs on the plane of the magnetic layer 502 and the non-straight angle Φ5 is formed between the magnetic layer 502 and the reference plane 101a of the substrate 101, the magnetoresistive sensing device 500 can be used to sense the magnetic field change in the Z-axis direction, which is substantially parallel with the plane of magnetic layer 502 and perpendicular to the reference plane 101a of the substrate 101.

Figure 6A:
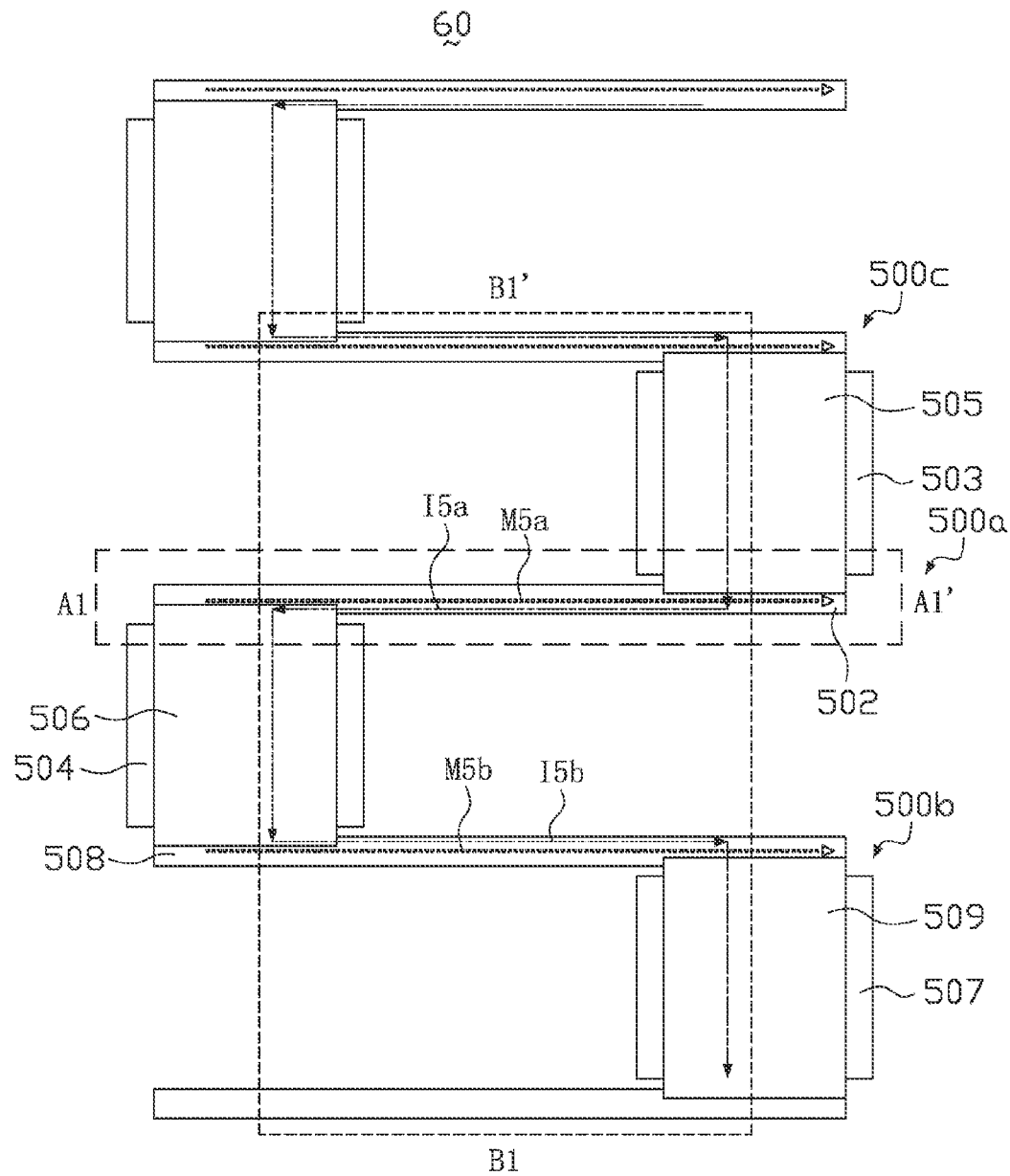
FIG. 6A is a schematic top view illustrating a magnetoresistive sensing device with a serpentine structure according to another embodiment of the present invention.

Moreover, for increasing the sensing capability of the magnetoresistive sensing device, plural magnetoresistive sensing devices may be connected in series. According to the spatial layout, an integrated magnetoresistive sensing device with a serpentine structure is formed. FIG. 6A is a schematic top view illustrating a magnetoresistive sensing device with a serpentine structure according to another embodiment of the present invention. The magnetoresistive sensing device 60 comprises plural magnetoresistive sensing units, wherein each of the magnetoresistive sensing units has the same structure as the magnetoresistive sensing device of FIG. 5 (e.g. taken along the line A1-A1'). In this embodiment, the magnetoresistive sensing device 60 comprises three magnetoresistive sensing units 500a, 500b and 500c.

Figure 6B:
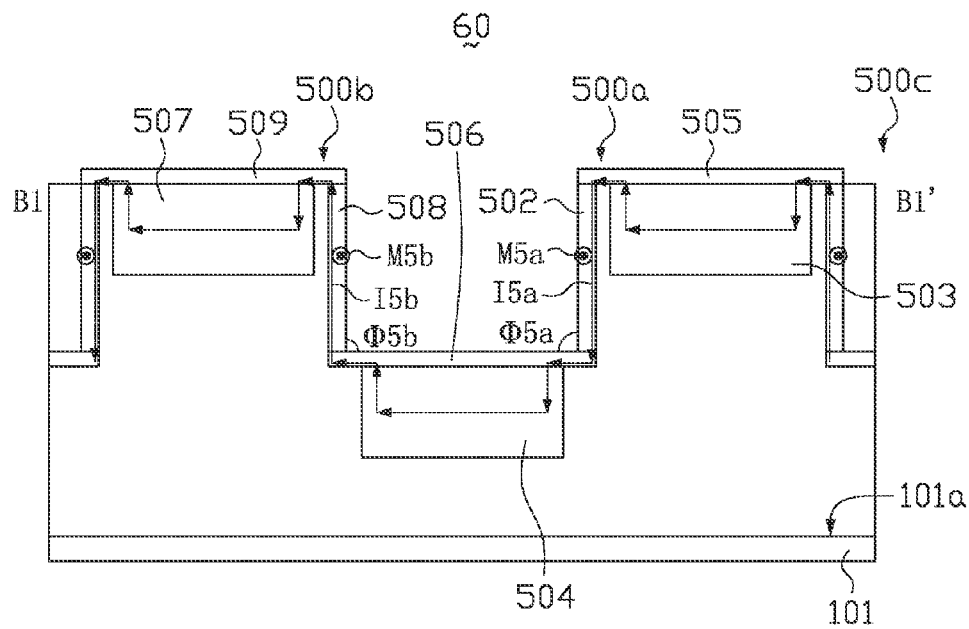
FIG. 6B is a schematic side view illustrating the magnetoresistive sensing device of FIG. 6A and taken along the line B1-B1'.

For increasing the ease of fabricating the magnetoresistive sensing device 60, the magnetoresistive sensing units 500a, 500b and 500c are connected in series through a continuous magnetic layer pattern. FIG. 6B is a schematic side view illustrating the magnetoresistive sensing device of FIG. 6A and taken along the line B1-B1'. For example, the magnetoresistive sensing unit 500a comprises two electrodes 504, 503 and three magnetic layers 502, 505, 506. The magnetoresistive sensing unit 500b comprises two electrodes 504, 507 and three magnetic layers 506, 508, 509. The magnetoresistive sensing unit 500c is not shown.

The magnetic layer 502 of the magnetoresistive sensing unit 500a has a magnetization direction M5a, and the magnetic layer 508 of the magnetoresistive sensing unit 500b has a magnetization direction M5b. Moreover, a non-straight angle Φ5a is formed between the magnetic layer 502 and the reference plane 101a, and a non-straight angle Φ5b is formed between the magnetic layer 508 and the reference plane 101a. The non-straight angle Φ5a and the non-straight angle Φ5b may be the same and preferably between 70° and 90°. Due to the shape anisotropy of the magnetic layer 502, if the external magnetic field is zero, the magnetization direction M5a of the magnetic layer 502 will be parallel with the plane and the long axis of the magnetic layer 502. Similarly, the magnetization direction M5b of the magnetic layer 508 will be parallel with the plane and the long axis of the magnetic layer 508. Moreover, a specified included angle θ5 is formed between the electric pathway I5a and the magnetization direction M5a and between the electric pathway I5b and the magnetization direction M5b (see FIG. 5).

Moreover, the magnetoresistive sensing device 60 employs the anisotropic magnetoresistance (AMR) structure and each of the magnetic layers 502, 505, 506, 508 and 509 comprises a single magnetic film. In some embodiments of the present invention, the magnetic layers 502, 505, 506, 508 and 509 are parts of a continuous magnetic layer pattern and formed at the same processing step.

For further increasing the sensing capability of the magnetoresistive sensing device, four magnetoresistive sensing devices may be connected with each other to form a Wheatstone bridge circuit.

Figure 7A:
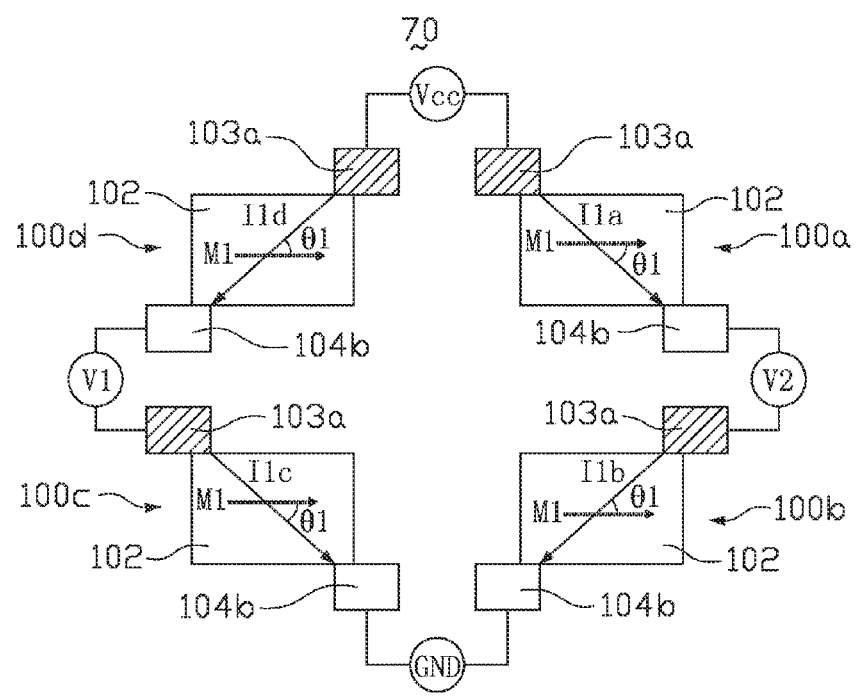
FIG. 7A schematically illustrates a wiring diagram of a magnetoresistive sensing device according to another embodiment of the present invention, in which the external magnetic field is zero.

FIG. 7A schematically illustrates a wiring diagram of a magnetoresistive sensing device according to another embodiment of the present invention, in which the external magnetic field is zero.

As shown in FIG. 7A, the magnetoresistive sensing device 70 comprises four magnetoresistive sensing devices as shown in FIG. 1. That is, the magnetoresistive sensing device 70 comprises a first magnetoresistive sensing unit 100a, a second magnetoresistive sensing unit 100b, a third magnetoresistive sensing unit 100c and a fourth magnetoresistive sensing unit 100d, which are electrically connected with each other to form a Wheatstone bridge circuit. The four magnetoresistive sensing units 100a, 100b, 100c and 100d have the same reference plane. Assume these four magnetoresistive sensing units have the same magnetization direction, the upper part 103a of the electrode 103 of the first magnetoresistive sensing unit 100a is located at the upper left side of the magnetic layer 102, the lower part 104b of the electrode 104 of the first magnetoresistive sensing unit 100a is located at the lower right side of the magnetic layer 102, and the two electrodes 103 and 104 are electrically connected with the magnetic layer 102. Moreover, the upper part 103a of the electrode 103 of the second magnetoresistive sensing unit 100b is located at the upper right side of the magnetic layer 102, and the lower part 104b of the electrode 104 of the second magnetoresistive sensing unit 100b is located at the lower left side of the magnetic layer 102. Moreover, the structure of the first magnetoresistive sensing unit 100a is identical to the structure of the third magnetoresistive sensing unit 100c, and the structure of the second magnetoresistive sensing unit 100b is identical to the structure of the fourth magnetoresistive sensing unit 100d. The electrodes of the first magnetoresistive sensing unit 100a and the fourth magnetoresistive sensing unit 100d are distributed in mirror symmetry. Moreover, the electrodes of the second magnetoresistive sensing unit 100b and the third magnetoresistive sensing unit 100c are distributed in mirror symmetry. When an external magnetic field substantially normal to the reference plane 101a is present, the magnetoresistive sensing units 100a and 100c have the same change in magnetoresistance, which is different from that of the magnetoresistive sensing units 100b and 100d. With the help of an external programming circuit (not shown), the magnetization directions of the magnetoresistive sensing units 100a and 100b and the magnetization directions of the magnetoresistive sensing units 100c and 100d may be adjusted to be identical and parallel with each other (e.g. in the magnetization direction M1) when no external magnetic field in the Z-axis direction substantially perpendicular to the reference plane is present. Under this circumstance, the included angle between the electric pathway I1a and the magnetization direction M1 and the included angle between the electric pathway I1c and the magnetization direction M1 are identical and equal to an acute angle θ1. Moreover, the included angle between the electric pathway I1b and the magnetization direction M1 and the included angle between the electric pathway I1d and the magnetization direction M1 are identical and may be equal to the acute angle θ1. The acute angle θ1 is preferably 45°.

Figure 7B:
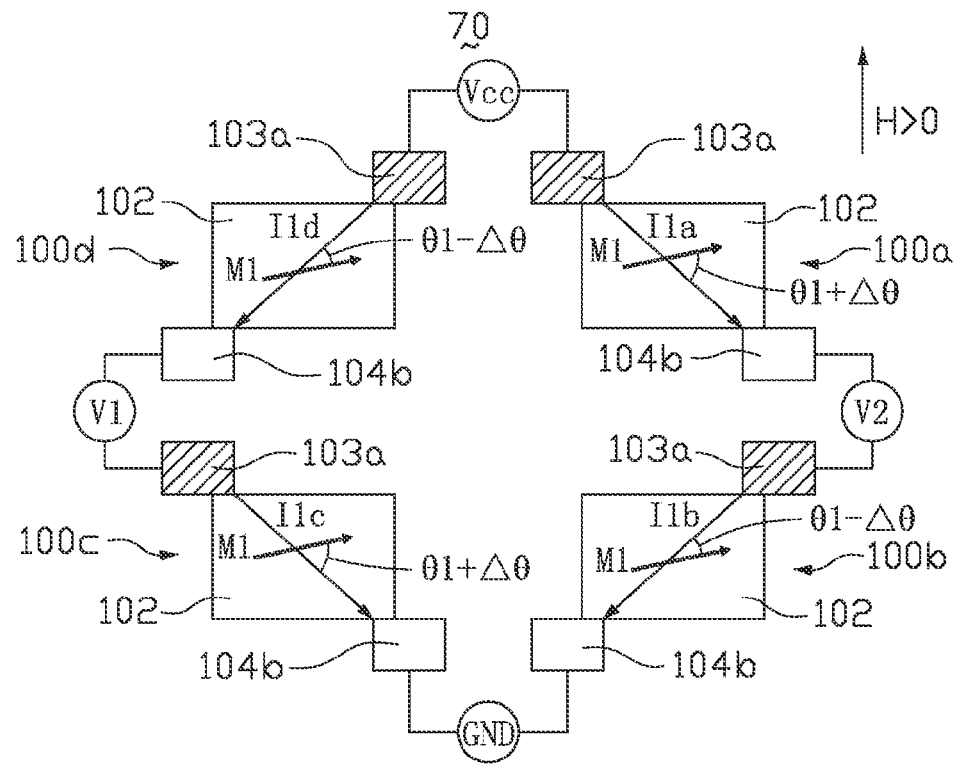
FIG. 7B schematically illustrates a wiring diagram of a magnetoresistive sensing device according to another embodiment of the present invention, in which the external magnetic field is not zero.

When the external magnetic field is not zero (e.g. an upward magnetic field H), as shown in FIG. 7B, the magnetization direction M1 of the four magnetoresistive sensing units 100a, 100b, 100c and 100d is correspondingly raised. Under this circumstance, the included angle between the electric pathway I1a and the magnetization direction M1 and the included angle between the electric pathway I1c and the magnetization direction M1 (for the magnetoresistive sensing units 100a and 100c) are increased to be θ1+Δθ, corresponding to a decreasing change in magnetoresistance. On the other hand, the included angle between the electric pathway I1b and the magnetization direction M1 and the included angle between the electric pathway I1d and the magnetization direction M1 (for the magnetoresistive sensing units 100b and 100d) are decreased to be θ1−Δθ, corresponding to an increasing change in magnetoresistance. By means of the wiring configuration of the Wheatstone bridge circuit, the magnetoresistance signal is amplified, and the magnetic field change can be measured more sensitively.

Figure 7C:
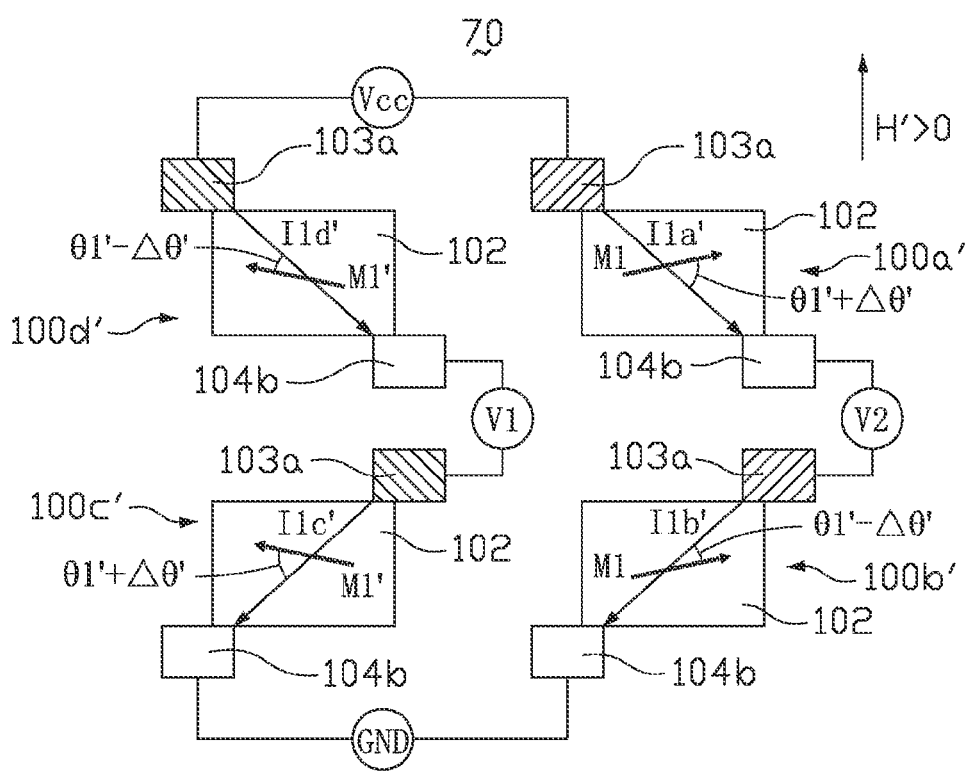
FIG. 7C schematically illustrates a wiring diagram of a magnetoresistive sensing device according to another embodiment of the present invention, in which the external magnetic field is not zero.

In accordance with the embodiment described above, the magnetization directions of the magnetoresistive sensing units 100a, 100b, 100c and 100d may be adjusted to be identical and parallel with each other. However, this is not the absolute case. In another embodiment of the present invention, the magnetization directions of the magnetoresistive sensing units 100a and 100c may be adjusted to be opposite and anti-parallel with each other Such condition applies to the magnetization directions of the magnetoresistive sensing units 100b and 100d. In response to the change in magnetization directions, each of the electric pathways I1a, I1b, I1c and I1d of the magnetic layer 102 should be modified as well by reallocating the two conducted electrodes with respect to the magnetic layer 102 in each magnetoresistive sensing unit. In other words, by adjusting the magnetization directions of the magnetoresistive sensing units 100a, 100b, 100c and 100d and adjusting the electric pathways I1a, I1b, I1c and I1d, various Wheatstone bridge circuit combinations can be obtained. In the Wheatstone bridge circuit of FIG. 7C, the magnetization directions M1' of the magnetoresistive sensing units 100c' and 100d' are opposite to the magnetization directions M1 of the magnetoresistive sensing units 100a' and 100b'. By adjusting the relative positions between the upper parts 103a of the electrodes 103, the lower parts 104b of the electrodes 104 and the magnetic layers 102 of the magnetoresistive sensing units 100a', 100b', 100c' and 100d', the electric pathways I1a', I1b', I1c' and I1d' are changed. Consequently, if the external magnetic field is not zero (e.g. an upward magnetic field H'), the included angle between the electric pathway I1a' and the magnetization direction M1 and the included angle between the electric pathway I1c' and the magnetization direction M1' (for the magnetoresistive sensing units 100a' and 100c') are increased to be θ1+Δθ, corresponding to a decreasing change in magnetoresistance. On the other hand, the included angle between the electric pathway I1b' and the magnetization direction M1 and the included angle between the electric pathway I1d' and the magnetization direction M1' (for the magnetoresistive sensing units 100b' and 100d') are decreased to be θ1−Δθ, corresponding to an increasing change in magnetoresistance.

From the above discussions, if a vertical magnetic field is sensed by the four magnetoresistive sensing units 100a, 100b, 100c and 100d (or the four magnetoresistive sensing units 100a', 100b', 100c' and 100d') of the Wheatstone bridge circuit, the acute angle between the electric pathway and the magnetization direction for one of the four magnetoresistive sensing units (e.g. the magnetoresistive sensing unit 100a) may be changed from θ to θ+Δθ. Under this circumstance, the acute angle between the electric pathway and the magnetization direction for two adjacent magnetoresistive sensing units (e.g. the magnetoresistive sensing units 100b and 100c) may be changed from θ to θ−Δθ.

Moreover, the above magnetoresistive sensing device for sensing the magnetic field change in the Z-axis direction (e.g. the magnetoresistive sensing device 30, 40 or 60) and the magnetoresistive sensing devices for sensing the magnetic field change in the X and Y directions parallel with the reference plane may be integrated into a three-dimensional magnetoresistive sensing device. More especially, the three-dimensional magnetoresistive sensing device may be fabricated in the same substrate in order to simultaneously measure the magnetic field changes in the X, Y and Z axes.

Figure 8:
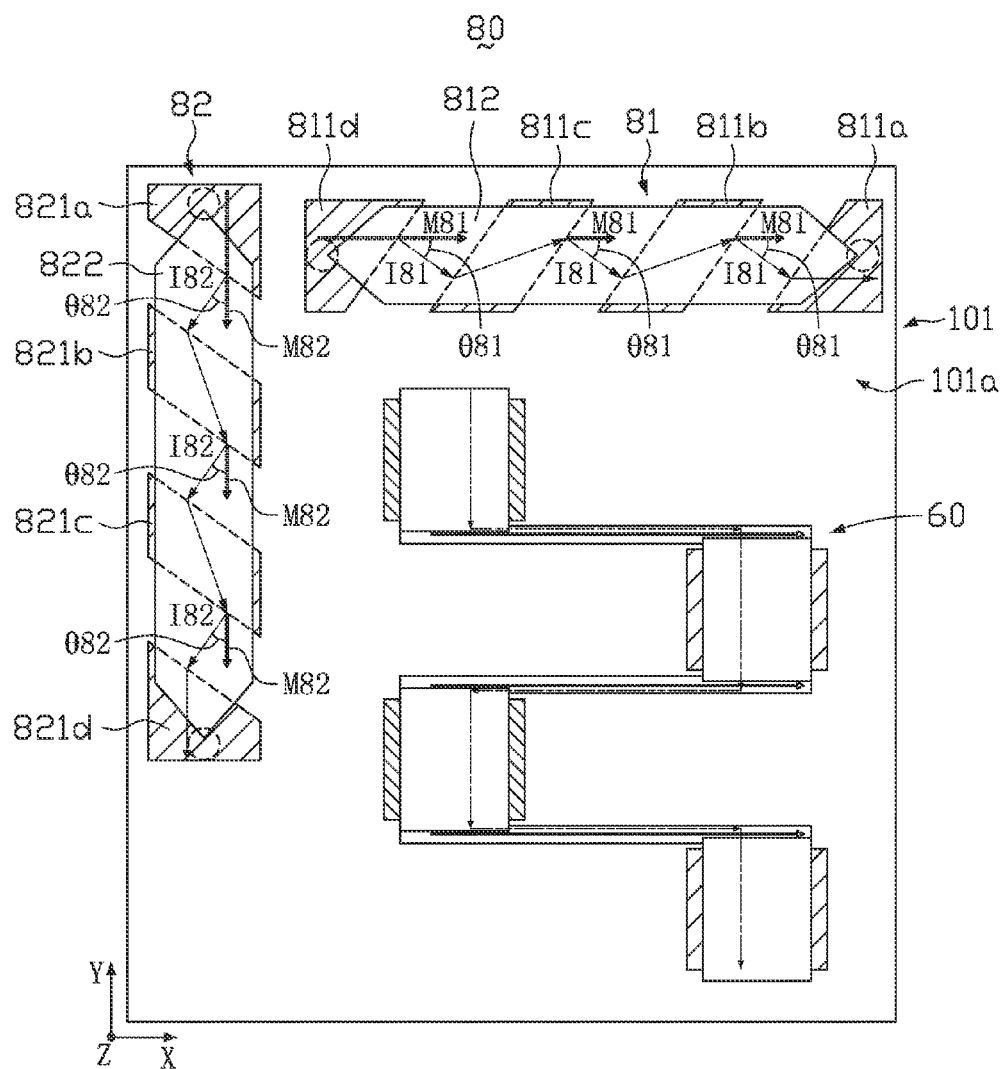
FIG. 8 is a schematic top view illustrating a three-dimensional magnetoresistive sensing device according to an embodiment of the present invention.

FIG. 8 is a schematic top view illustrating a three-dimensional magnetoresistive sensing device according to an embodiment of the present invention.

As shown in FIG. 8, the three-dimensional magnetoresistive sensing device 80 comprises a magnetoresistive sensing device for sensing the magnetic field change in the Z-axis direction substantially perpendicular to the reference plane 101a of the substrate 101 (e.g. the magnetoresistive sensing device 60 as shown in FIG. 6A), a magnetoresistive sensing device 81 for sensing the magnetic field change in the Y-axis direction and a magnetoresistive sensing device 82 for sensing the magnetic field change in the X-axis direction.

The magnetoresistive sensing devices 81 and 82 may be implemented by the conventional barber-pole design. The magnetoresistive sensing device 60 and the magnetoresistive sensing devices 81 and 82 may be formed on the same semiconductor chip (e.g. the substrate 101). The structures and the operations of the Z-axis direction magnetoresistive sensing device 60 have been mentioned above, and are not redundantly described herein.

The Y-axis direction magnetoresistive sensing device 81 comprises a magnetic layer 812 and plural electrodes 811a, 811b, 811c and 811d. The magnetic layer 812 can be formed at the same processing step with the magnetic layers 502, 505, 506, 508 and 509 of the magnetoresistive sensing device 60 of FIG. 6A, but is not limited thereto. Each of the electrodes 811a, 811b, 811c and 811d can be formed at the same processing step with the electrode 503 or 504 of the magnetoresistive sensing device 60 of FIG. 6A, but is not limited thereto. The number of the electrodes of the Y-axis direction magnetoresistive sensing device 81 may be varied according to the practical requirements. The longitudinal direction of the magnetic layer 812 is perpendicular to the Y-axis direction of the reference plane 101a of the substrate 101. Moreover, the magnetic layer 812 is contacted with the electrodes 811a, 811b, 811c and 811d. By conducting the electrodes 811a and 811d, an electric current flows through the magnetic layer 812 and creates plural electric pathways I81 at the contact-free parts of the magnetic layer 812 between the electrodes 811a, 811b, 811c and 811d.

The X-axis direction magnetoresistive sensing device 82 comprises a magnetic layer 822 and plural electrodes 821a, 821b, 821c and 821d. The magnetic layer 822 can be formed at the same processing step with the magnetic layers 502, 505, 506, 508 and 509 of the magnetoresistive sensing device 60 of FIG. 6A, but is not limited thereto. Each of the electrodes 821a, 821b, 821c and 821d can be formed at the same processing step with the electrode 503 or 504 of the magnetoresistive sensing device 60 of FIG. 6A, but is not limited thereto. The longitudinal direction of the magnetic layer 822 is perpendicular to the X-axis direction of the reference plane 101a of the substrate 101. Moreover, the magnetic layer 822 is contacted with the electrodes 821a, 821b, 821c and 821d. By conducting the electrodes 821a and 821d, an electric current flows through the magnetic layer 822 and creates plural electric pathways I82 at the contact-free parts of the magnetic layer 812 between the electrodes 821a, 821b, 821c and 821d.

The longitudinal direction of the magnetic layer 812 is perpendicular to the Y-axis direction of the reference plane 101a of the substrate 101. According to the shape anisotropy of the magnetic layer 812, if the external magnetic field is zero, the magnetic layer 812 has a magnetization direction M81 perpendicular to the Y-axis direction of the reference plane 101a of the substrate 101. Moreover, a specified included angle θ81 is formed between the electric pathway I81 and the magnetization direction M81. The specified included angle θ81 is preferably 45°. The magnetoresistive sensing device 81 composed of the magnetic layer 812 and the electrodes 811a, 811b, 811c and 811d may be used for sensing the magnetic field change in the Y-axis direction.

Similarly, longitudinal direction of the magnetic layer 822 is perpendicular to the X-axis direction of the reference plane 101a of the substrate 101. According to the shape anisotropy of the magnetic layer 822, if the external magnetic field is zero, the magnetic layer 822 has a magnetization direction M82 perpendicular to the X-axis direction of the reference plane 101a of the substrate 101. Moreover, a specified included angle θ82 is formed between the electric pathway I82 and the magnetization direction M82. The specified included angle θ82 is preferably 45°. The magnetoresistive sensing device 82 composed of the magnetic layer 822 and the electrodes 821a, 821b, 821c and 821d may be used for sensing the magnetic field change in the X-axis direction.

From the above descriptions, the present invention provides a magnetoresistive sensing device. The magnetoresistive sensing device includes a substrate, a magnetic layer, a first electrode and a second electrode. The substrate has a reference plane. A non-straight angle is formed between the magnetic layer and the reference plane. The first electrode and the second electrode are electrically connected with each other through an electric pathway. A first included angle is formed between the electric pathway and the magnetization direction. Consequently, the magnetoresistive sensing device is capable of measuring a magnetic field change in a Z-axis direction, which is substantially perpendicular to a reference plane. Moreover, the magnetoresistive sensing unit for measuring the magnetic field change in the Z-axis direction and the magnetoresistive sensing units for sensing the magnetic field change in the X-Y directions parallel with the reference plane may be integrated into a three-dimensional magnetoresistive sensing device. Moreover, the magnetoresistive sensing units for sensing the three-dimensional magnetic field changes may be formed on the same semiconductor chip. Since the additional flux concentrator is not necessary, the magnetoresistive sensing device of the present invention has simplified structure. Moreover, the method for fabricating the magnetoresistive sensing device of the present invention is simplified and cost-effective and has good production yield.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A magnetoresistive sensing device, comprising:
   a substrate having a reference plane;
   a first electrode disposed over the reference plane;
   a second electrode disposed over the reference plane; and
   a first magnetic layer disposed over the reference plane and having a first magnetization direction, wherein a first non-straight angle is formed between the first magnetic layer and the reference plane, and the first electrode and the second electrode are electrically connected with each other through a first electric pathway coplanar with the first magnetic layer, wherein a first included angle is formed between the first electric pathway and the first magnetization direction.

2. The magnetoresistive sensing device according to claim 1, wherein the substrate is a silicon substrate covered with insulating material, or the substrate is a silicon chip having previously formed logic circuits.

3. The magnetoresistive sensing device according to claim 1, wherein an upper part of the first electrode and a lower part of the second electrode are electrically connected with each other through the first electric pathway.

4. The magnetoresistive sensing device according to claim 3, wherein the upper part of the first electrode and an upper part of the second electrode are parts of a first patterned metal layer, and a lower part of the first electrode and the lower part of the second electrode are parts of a second patterned metal layer.

5. The magnetoresistive sensing device according to claim 1, further comprising:
   a third electrode disposed over the reference plane; and
   a second magnetic layer disposed over the reference plane and having a second magnetization direction, wherein a second non-straight angle is formed between the second magnetic layer and the reference plane, and the third electrode and the second electrode are electrically connected with each other through a second electric pathway of the second magnetic layer, wherein a second included angle is formed between the second electric pathway and the second magnetization direction.

6. The magnetoresistive sensing device according to claim 5, wherein an upper part of the second electrode and a lower part of the third electrode are electrically connected with each other through the second electric pathway.

7. The magnetoresistive sensing device according to claim 6, wherein the first non-straight angle is substantially equal to the second non-straight angle, wherein the first magnetization direction is substantially identical to the second magnetization direction.

8. The magnetoresistive sensing device according to claim 7, wherein the first magnetic layer and the second magnetic layer are coplanar, integrally formed with each other, and connected with each other.

9. The magnetoresistive sensing device according to claim 8, wherein the first magnetic layer is spanned across an upper part of the first electrode and the upper part of the second electrode and has a jumper resistance valve in between, wherein the jumper resistance value is larger than the sum of a first resistance value of the first electric pathway and a second resistance value of the second electrode from the lower part to the upper part.

10. The magnetoresistive sensing device according to claim 5, further comprising:
 a third magnetic layer disposed over the first electrode, and electrically connected with the first electrode and the first magnetic layer;
 a fourth magnetic layer disposed over the third electrode, and electrically connected with the third electrode and the second magnetic layer; and
 a fifth magnetic layer disposed over the second electrode, and electrically connected with the first magnetic layer, the second electrode and the second magnetic layer.

11. The magnetoresistive sensing device according to claim 10, wherein each of the first magnetic layer, the second magnetic layer, the third magnetic layer, the fourth magnetic layer and the magnetic layer is made of a magnetic material.

12. A magnetoresistive sensing device comprising four magnetoresistive sensing units, each of which having the same structure as the magnetoresistive sensing device according to claim 1, wherein the four magnetoresistive sensing units comprise a first magnetoresistive sensing unit, a second magnetoresistive sensing unit, a third magnetoresistive sensing unit and a fourth magnetoresistive sensing unit, which are connected with each other to form a Wheatstone bridge circuit, wherein the four magnetoresistive sensing units share the same reference plane and a common substrate.

13. The magnetoresistive sensing device according to claim 12, wherein the first included angle of the first magnetoresistive sensing unit is a first acute angle, the second included angle of the second magnetoresistive sensing unit is a second acute angle, and the second acute angle is substantially equal to the first acute angle, wherein when a magnetic field perpendicular to the reference plane is applied, the first acute angle is increased, and the second acute angle is decreased.

14. The magnetoresistive sensing device according to claim 13, wherein the first magnetoresistive sensing unit and the third magnetoresistive sensing unit have a decreasing change in magnetoresistance, wherein the second magnetoresistive sensing unit and the fourth magnetoresistive sensing unit have an increasing change in magnetoresistance.

15. A magnetoresistive sensing device, comprising:
 a substrate having a reference plane;
 a first magnetic layer disposed over the reference plane and having a first magnetization direction, wherein a first non-straight angle is formed between the first magnetic layer and the reference plane;
 a second magnetic layer disposed over the reference plane and parallel with the reference plane, and having a second magnetization direction; and
 a third magnetic layer disposed over the reference plane and parallel with the reference plane, and having a third magnetization direction, wherein the third magnetization direction is perpendicular to the second magnetization direction.

16. The magnetoresistive sensing device according to claim 15, further comprising a first electrode and a second electrode, wherein the first electrode is contacted with a top edge of the first magnetic layer, and the second electrode is contacted with a bottom edge of the first magnetic layer.

17. The magnetoresistive sensing device according to claim 15, further comprising plural electrodes, wherein the plural electrodes are electrically contacted with the second magnetic layer.

18. The magnetoresistive sensing device according to claim 15, further comprising plural electrodes, wherein the plural electrodes are electrically contacted with the third magnetic layer.

19. The magnetoresistive sensing device according to claim 15, wherein the substrate is a silicon substrate covered with insulating material, or the substrate is a silicon chip having previously formed logic circuits.

* * * * *